(12) United States Patent
Lee et al.

(10) Patent No.: US 10,163,627 B2
(45) Date of Patent: Dec. 25, 2018

(54) SEMICONDUCTOR DEVICE AND METHOD FOR FABRICATING THE SAME

(71) Applicant: TAIWAN SEMICONDUCTOR MANUFACTURING CO., LTD., Hsinchu (TW)

(72) Inventors: Tung-Ying Lee, Hsinchu (TW); Shao-Ming Yu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/598,439

(22) Filed: May 18, 2017

(65) Prior Publication Data

US 2018/0337034 A1 Nov. 22, 2018

(51) Int. Cl.
*H01L 29/34* (2006.01)
*H01L 21/02* (2006.01)
*H01L 29/16* (2006.01)

(52) U.S. Cl.
CPC ...... *H01L 21/0243* (2013.01); *H01L 21/0245* (2013.01); *H01L 21/02381* (2013.01); *H01L 21/02532* (2013.01); *H01L 21/02639* (2013.01); *H01L 29/16* (2013.01); *H01L 29/34* (2013.01)

(58) Field of Classification Search
CPC ................................................. H01L 21/0243
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2006/0197126 A1* | 9/2006 | Lochtefeld ........ H01L 21/76254 257/288 |
| 2006/0292719 A1* | 12/2006 | Lochtefeld ........ H01L 21/02381 438/22 |
| 2011/0117730 A1* | 5/2011 | Wann ................ H01L 21/02381 438/479 |
| 2017/0018427 A1* | 1/2017 | Huang .............. H01L 21/02164 |

(Continued)

*Primary Examiner* — Eugene Lee
(74) *Attorney, Agent, or Firm* — McClure, Qualey & Rodack, LLP (57) ABSTRACT

A semiconductor device includes a substrate, a first dielectric layer, a first semiconductor layer, a second dielectric layer and a second semiconductor layer. The first dielectric layer is disposed on the substrate and includes at least one first trench formed in the first dielectric layer. The first semiconductor layer is disposed on the first dielectric layer and within the at least one first trench. The second dielectric layer is disposed on the first semiconductor layer and includes at least one second trench formed in the second dielectric layer, wherein in a planar view, the at least one first trench and the at least one second trench are not overlapped with each other. The second semiconductor layer is disposed on the second dielectric layer and within the at least one second trench.

20 Claims, 6 Drawing Sheets

(56) References Cited

U.S. PATENT DOCUMENTS

2017/0110333 A1\* 4/2017 Beveridge ......... H01L 21/30625
2017/0110334 A1\* 4/2017 Kawamoto ....... H01L 21/30625
2017/0133222 A1\* 5/2017 Park ................. H01L 21/02532
2017/0271146 A1\* 9/2017 Reznicek ........... H01L 21/0243

\* cited by examiner

SEMICONDUCTOR DEVICE AND METHOD FOR FABRICATING THE SAME

BACKGROUND

Aspect ratio trapping (ART) technology has been used widely. In ART technology, if the epitaxy is performed at the later process of the manufacturing processes, it is hard to well-control long direction's defect along trenches formed by the manufacturing processes. In another condition, if the epitaxy is performed at the former process of the manufacturing processes, the epitaxy will grow on the flat silicon (Si) surface, which is hard to well-control epitaxy defect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1:
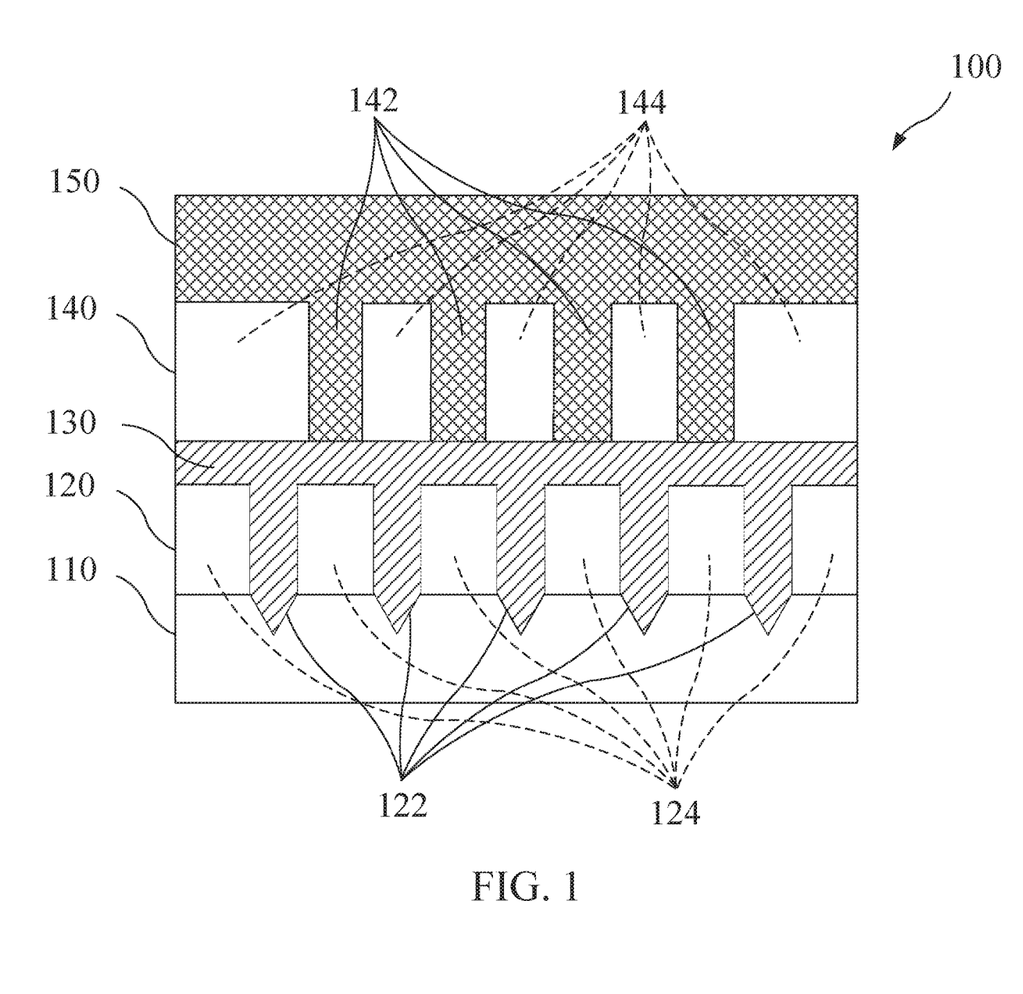
FIG. 1 is a cross-sectional view of a semiconductor device, in accordance with various embodiments.

Reference is now made to FIG. 1. FIG. 1 is a cross-sectional view of a semiconductor device 100, in accordance with various embodiments of the present disclosure. As illustrated in FIG. 1, the semiconductor device 100 includes a substrate 110, a first dielectric layer 120, a first semiconductor layer 130, a second dielectric layer 140 and a second semiconductor layer 150. The first dielectric layer 120 is disposed on the substrate 110. In some embodiments, the substrate 110 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. In some embodiments, the first dielectric layer 120 is made of, for example, oxide; a compound semiconductor, such as silicon oxide or silicon nitride.

In various embodiments, the first dielectric layer 120 includes at least one first trench 122 which is formed in the first dielectric layer 120. In various embodiments, the first dielectric layer 120 is etched to its bottom so as to expose the substrate 110, or part of the substrate 110 is further etched to form first trenches 122 in the first dielectric layer 120 and the substrate 110 depending on actual requirements. In some embodiments, the bottom of the at least one first trench 122 is V-shaped. However, other suitable shapes of the bottom of the at least one first trench 122 are within the contemplated scope of the present disclosure.

As illustrated in FIG. 1, the first semiconductor layer 130 is disposed on the first dielectric layer 120 and within the at least one first trench 122. Explained in a different way, the at least one first trench 122 is filled with the first semiconductor layer 130. In some embodiments, the first semiconductor layer 130 is formed by chemical vapor deposition (CVD), for example, low-pressure CVD (LPCVD), atomic layer CVD (ALCVD), ultrahigh vacuum CVD (UHVCVD), reduced pressure CVD (RPCVD), or other suitable CVDs; molecular beam epitaxy (MBE) process; other suitable epitaxial processes; or combinations thereof. In various embodiments, the first semiconductor layer 130 is made of a semiconductor material, such as germanium (Ge), silicon carbide (SiC), silicon germanium (SiGe), an III-V compound semiconductor, combinations thereof, or the like.

In some embodiments, the second dielectric layer 140 is disposed on the first semiconductor layer 130. The second dielectric layer 140 includes at least one second trench 142 which is formed in the second dielectric layer 140. In various embodiments, the second dielectric layer 140 is made of, for example, oxide; a compound semiconductor, such as silicon oxide or silicon nitride. The second semiconductor layer 150 is disposed on the second dielectric layer 140 and within the at least one second trench 142. Explained in a different way, the at least one second trench 142 is filled with the second semiconductor layer 150. In some embodiments, the second semiconductor layer 150 is formed by chemical vapor deposition (CVD), for example, low-pressure CVD (LPCVD), atomic layer CVD (ALCVD), ultrahigh vacuum CVD (UHVCVD), reduced pressure CVD (RPCVD), or other suitable CVDs; molecular beam epitaxy (MBE) process; other suitable epitaxial processes; or combinations thereof. In various embodiments, the second semiconductor layer 150 is made of a semiconductor material, such as germanium (Ge), silicon carbide (SiC), silicon germanium (SiGe), an III-V compound semiconductor, combinations thereof, or the like.

In various embodiments, the thickness of the first dielectric layer 120 and the second dielectric layer 140 are the same, or the thickness of the first dielectric layer 120 is larger or less than that of the second dielectric layer 140 depending on actual requirements. As illustrated in FIG. 1, the width of the first trench 122 and the second trench 142 are the same, or the width of the first trench 122 is larger or less than that of the second trench 142 depending on actual requirements. In some embodiments, the depth of the first trench 122 and the second trench 142 are the same, or the depth of the first trench 122 is larger or less than that of the second trench 142 depending on actual requirements.

In a planar view, the at least one first trench 122 and the at least one second trench 142 are not overlapped with each other. Explained in a different way, the at least one first trench 122 is not aligned with the at least one second trench 142. From another point of view, the at least one second trench 142 is not disposed right above the at least one first trench 122.

In some embodiments, the second dielectric layer 140 includes a plurality of second trenches 142 and a plurality of second dielectric layer portions 144, and each one of the second trenches 142 is interposed between two of the second dielectric layer portions 144. As illustrated in FIG. 1, the first trenches 122 vertically overlap with the second dielectric layer portions 144, respectively. Explained in a different way, one of the second dielectric layer portions 144 is located above one of the first trenches 122. In various embodiments, the second trenches 142 and the second dielectric layer portions 144 are disposed in turn. For example, the sequence is as follow: the second trench 142, the second dielectric layer portion 144, the second trench 142, the second dielectric layer portion 144, and so on. However, the scope of the disclosure is not intended to be limited in such sequence, and other suitable sequence of the second trenches 142 and the second dielectric layer portions 144 are within the contemplated scope of the present disclosure.

As illustrated in FIG. 1, the first dielectric layer 120 also includes a plurality of first trenches 122 and a plurality of first dielectric layer portions 124, and each one of the first trenches 122 is interposed between two of the first dielectric layer portions 124. In some embodiments, the second trenches 142 vertically overlap with the second dielectric layer portions 124, respectively. Explained in a different way, one of the second trenches 142 is located above one of the first dielectric layer portions 124. In various embodiments, the first trenches 122 and the first dielectric layer portions 124 are disposed in turn. For example, the sequence is as follow: the first trench 122, the first dielectric layer portion 124, the first trench 122, the first dielectric layer portion 124, and so on. However, the scope of the disclosure is not intended to be limited in such sequence, and other suitable sequence of the first trenches 122 and the first dielectric layer portions 124 are within the contemplated scope of the present disclosure.

In various embodiments, the second semiconductor layer 150 includes a first material, and the first semiconductor layer 130 includes at least the first material. Explained in a different way, the second semiconductor layer 150 is formed of germanium (Ge), and the first semiconductor layer 130 is formed of at least germanium (Ge). For example, the second semiconductor layer 150 is totally formed of germanium (Ge), and the first semiconductor layer 130 is partially formed of germanium (Ge). In view of the above, the first semiconductor layer 130 and the second semiconductor layer 150 has the same material, and the misfit defect therebetween due to lattice mismatch is therefore reduced. The "materials" of the first semiconductor layer 130 and the second semiconductor layer 150 are given for illustrative purposes only. Various "materials" of the first semiconductor layer 130 and the second semiconductor layer 150 are within the contemplated scope of the present disclosure.

In some embodiments, the first semiconductor layer 130 is formed of 25% silicon (Si) and 75% germanium (Ge), and the second semiconductor layer 150 is totally formed of germanium (Ge). In various embodiments, the first semiconductor layer 130 is formed of 50% silicon (Si) and 50% germanium (Ge), and the second semiconductor layer 150 is totally formed of germanium (Ge). In some embodiments, the first semiconductor layer 130 is formed of 75% silicon (Si) and 25% germanium (Ge), and the second semiconductor layer 150 is totally formed of germanium (Ge). In view of the above, the silicon (Si) in the first semiconductor layer 130 ranges from 25-75%, and the germanium (Ge) in the first semiconductor layer 130 ranges from 25-75% correspondingly. However, the scope of the disclosure is not intended to be limited in such ranges, and other suitable proportion of material in the first semiconductor layer 130 is within the contemplated scope of the present disclosure.

In various embodiments, the first semiconductor layer 130 and the second semiconductor layer 150 are formed of a same material. Explained in a different way, the first semiconductor layer 130 is totally formed of germanium (Ge), and the second semiconductor layer 150 is also totally formed of germanium (Ge). Hence, there is almost no misfit defect between the first semiconductor layer 130 and the second semiconductor layer 150 due to lattice mismatch.

Figure 2:
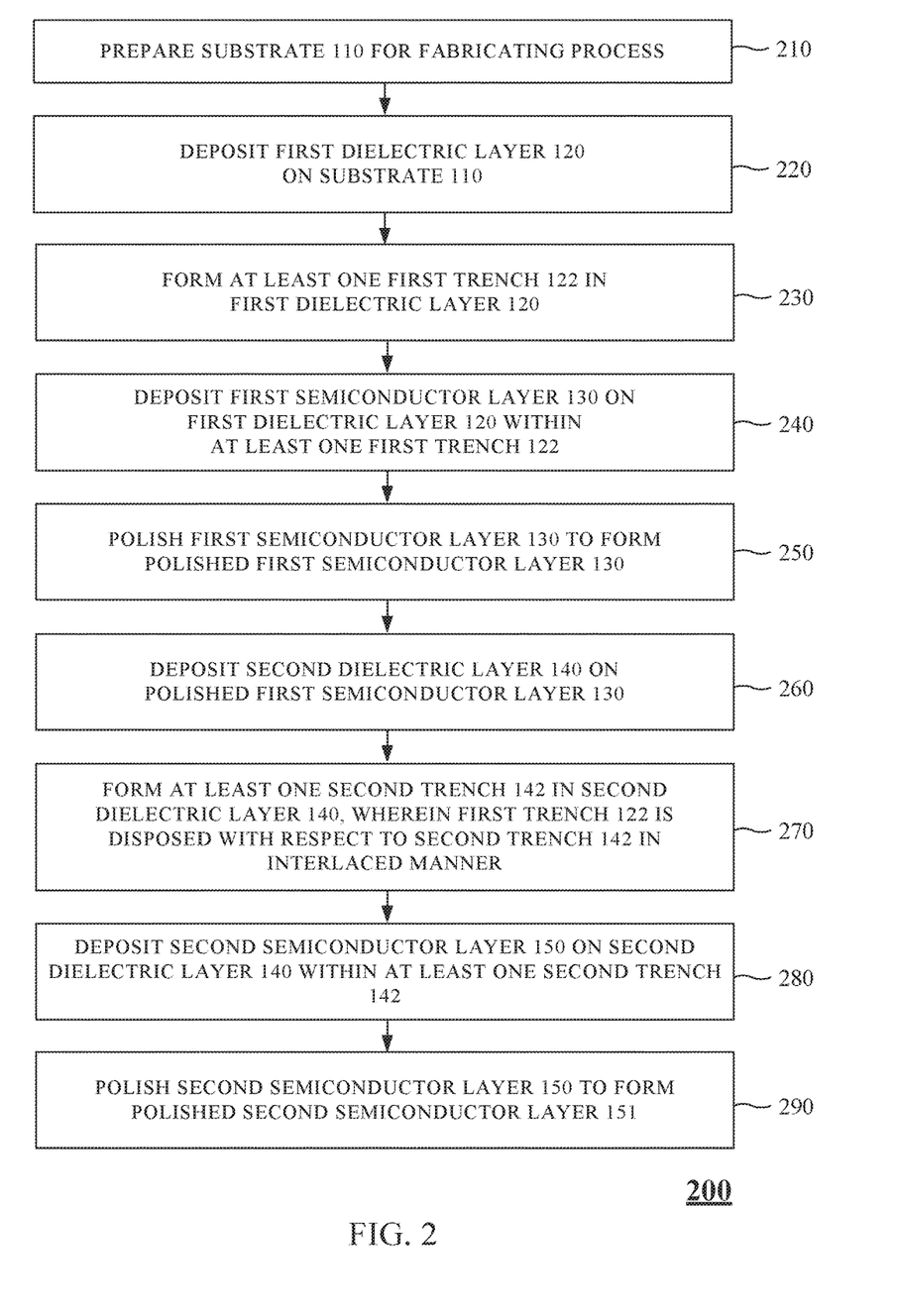
FIG. 2 is a flow chart of a method for fabricating the semiconductor device in FIG. 1, in accordance with various embodiments.

Reference is now made to FIG. 2. FIG. 2 is a flow chart of a method 200 for fabricating the semiconductor device 100 in FIG. 1, in accordance with various embodiments of the present disclosure. For illustration, the fabricating process of the semiconductor device 100 in FIG. 1 is described by the method 200 together with FIG. 3A to FIG. 3J. FIG. 3A to FIG. 3J are cross-sectional views of different steps of the method 200 for fabricating the semiconductor device 100 in FIG. 1, in accordance with various embodiments.

Figure 3A:
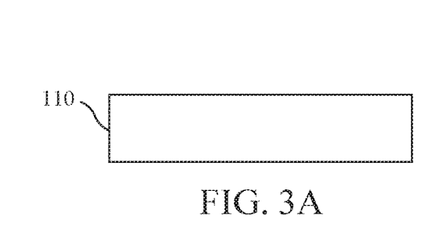
FIG. 3A to FIG. 3J are cross-sectional views of different steps of a method for fabricating the semiconductor device in FIG. 1, in accordance with various embodiments.

With reference to the method 200 in FIG. 2, in operation 210, a substrate 110 is prepared for the fabricating process, as illustrated in FIG. 3A. In some embodiments, the substrate 110 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide.

Figure 3B:
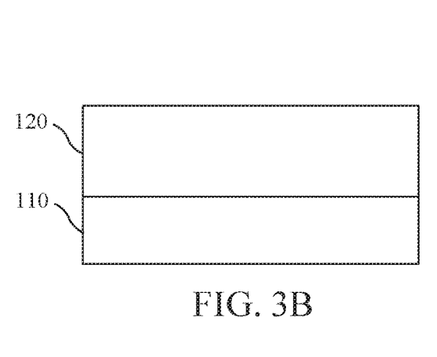

In operation 220, the first dielectric layer 120 is deposited on the substrate 110, as illustrated in FIG. 3B. In some embodiments, the operation 220 is an isolation oxide deposition process. In various embodiments, the first dielectric layer 120 is made of, for example, oxide; a compound semiconductor, such as silicon oxide or silicon nitride.

Figure 3C:
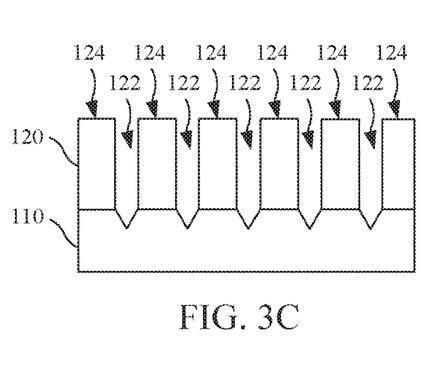

In operation 230, at least one first trench 122 is formed in the first dielectric layer 120, as illustrated in FIG. 3C. In various embodiments, the at least one first trench 122 is formed by etching the first dielectric layer 120. Although the bottom of the at least one first trench 122 in FIG. 3C is V-shaped, the present disclosure is not limited thereto. Other suitable shapes of the bottom of the at least one first trench 122 are within the contemplated scope of the present disclosure. In some embodiments, the first dielectric layer 120 is etched to its bottom so as to expose the substrate 110, or part of the substrate 110 is further etched to form first trenches 122 in the first dielectric layer 120 and the substrate 110 depending on actual requirements. In some embodiments, the first dielectric layer 120 is etched to form a plurality of first trenches 122.

As illustrated in FIG. 3C, the first dielectric layer 120 is etched to form a plurality of first trenches 122 and a plurality of first dielectric layer portions 124, and each one of the first trenches 122 is interposed between two of the first dielectric layer portions 124. Such process is a hole patterning process for forming first trenches 122 arranged in a pattern.

Figure 3D:
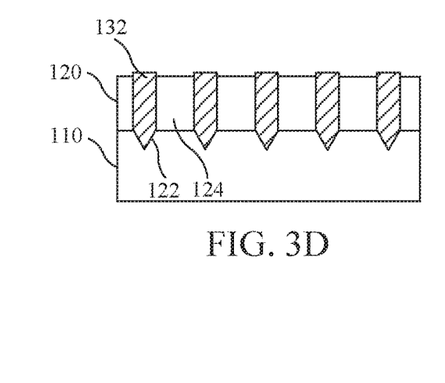
Figure 3E:
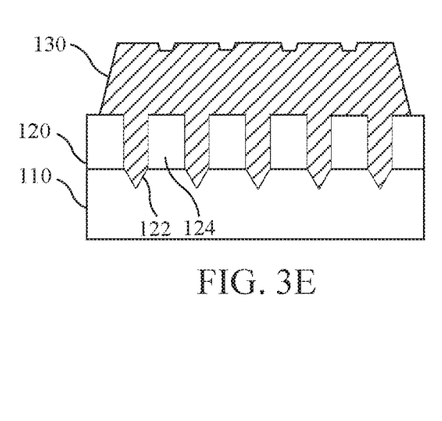

In operation 240, the first semiconductor layer 130 is deposited on the first dielectric layer 120 within the at least one first trench 122, as illustrated in FIG. 3D to FIG. 3E. As illustrated in FIG. 3D, the first trenches 122 are filled with first material to form filled first trenches 132. In some embodiments, the process illustrated in FIG. 3D is a semiconductor (i.e., germanium (Ge)) vertical growth in hole process. As illustrated in FIG. 3E, the first semiconductor layer 130 is deposited on the first dielectric layer 120 and the filled first trenches 132. In various embodiments, the process illustrated in FIG. 3E is a semiconductor (i.e., germanium (Ge)) lateral growth process. For facilitating the fabricating process, in some embodiments, processes as illustrated in FIG. 3D and FIG. 3E are performed in a single one process. In some embodiments, the first semiconductor layer 130 is formed by chemical vapor deposition (CVD), for example, low-pressure CVD (LPCVD), atomic layer CVD (ALCVD), ultrahigh vacuum CVD (UHVCVD), reduced pressure CVD (RPCVD), or other suitable CVDs; molecular beam epitaxy (MBE) process; other suitable epitaxial processes; or combinations thereof. In various embodiments, the first semiconductor layer 130 is made of a semiconductor material, such as germanium (Ge), silicon carbide (SiC), silicon germanium (SiGe), an III-V compound semiconductor, combinations thereof, or the like.

Figure 3F:
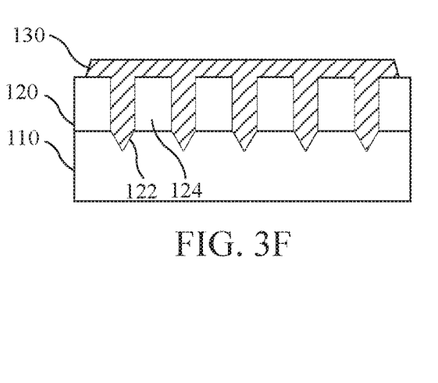

In operation 250, the first semiconductor layer 130 is polished to form a polished first semiconductor layer 130, as illustrated in FIG. 3F. In various embodiments, the operation 250 is performed with a Chemical-Mechanical Polishing (CMP) process. CMP for planarization of semiconductor is now widely known to those skilled in the art and has been described in numerous patents and open literature publications. In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad parallel to the substrate. Polishing is continued in this manner until the desired film on the substrate is removed with the usual objective being to effectively planarize the substrate.

Figure 3G:
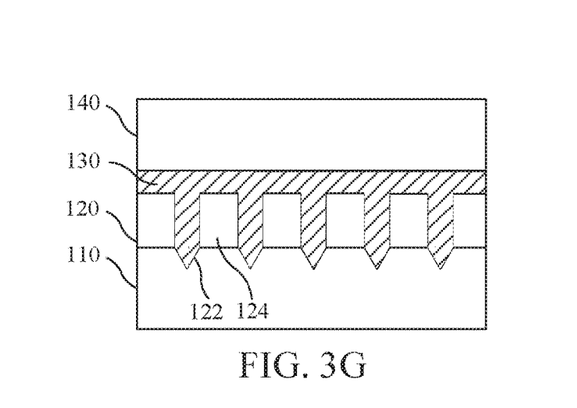

In operation 260, the second dielectric layer 140 is deposited on the polished first semiconductor layer 130, as illustrated in FIG. 3G. In some embodiments, the operation 260 is an isolation oxide deposition process. In various embodiments, the second dielectric layer 140 is made of, for example, oxide; a compound semiconductor, such as silicon oxide.

Figure 3H:
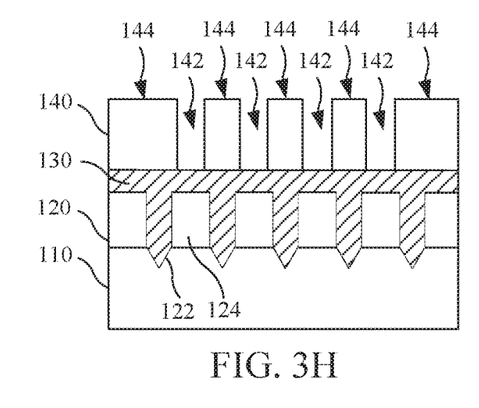

In operation 270, at least one second trench 142 is formed in the second dielectric layer 140, wherein the first trench 122 is disposed with respect to the second trench 142 in an interlaced manner, as illustrated in FIG. 3H. In various embodiments, the second dielectric layer 140 is etched to form second trenches 142 and second dielectric layer portions 144, and each one of the second trenches 142 is interposed between two of the second dielectric layer portions 144. Therefore, the first trenches 122 vertically overlap with the second dielectric layer portions 144, respectively. In some embodiments, the second trenches 142 and the second dielectric layer portions 144 are etched to be formed in turn. For example, the sequence is as follow: the second trench 142, the second dielectric layer portion 144, the second trench 142, the second dielectric layer portion 144, and so on. However, other suitable sequence of the second trenches 142 and the second dielectric layer portions 144 are within the contemplated scope of the present disclosure. In some embodiments, each one of the first trenches 122 is not aligned with the second trenches 142. Explained in a different way, in a planar view, the at least one first trench 122 and the at least one second trench 142 are not overlapped with each other. In some embodiments, the operation 270 is a hole patterning process for forming second trenches 142 arranged in a pattern.

As illustrated in FIG. 3H, the second dielectric layer 140 is etched to form a plurality of second trenches 142 and a plurality of second dielectric layer portions 144, and each one of the second trenches 142 is interposed between two of the second dielectric layer portions 144. In some embodiments, the first trenches 122 are formed to be vertically overlapped with the second dielectric layer portions 144, respectively. Explained in a different way, one of the second dielectric layer portions 144 is located above one of the first trenches 122. In various embodiments, the second trenches 142 and the second dielectric layer portions 144 are etched to be formed in turn. For example, the sequence is as follow: the second trench 142, the second dielectric layer portion 144, the second trench 142, the second dielectric layer portion 144, and so on. However, the scope of the disclosure is not intended to be limited in such sequence, and other suitable sequence of the second trenches 142 and the second dielectric layer portions 144 are within the contemplated scope of the present disclosure.

In some embodiments, the second trenches 142 are formed to be vertically overlapped with the second dielectric layer portions 124, respectively. Explained in a different way, one of the second trenches 142 is located above one of the first dielectric layer portions 124. In various embodiments, the first trenches 122 and the first dielectric layer portions 124 are etched to be formed in turn. For example, the sequence is as follow: the first trench 122, the first dielectric layer portion 124, the first trench 122, the first dielectric layer portion 124, and so on. However, the scope of the disclosure is not intended to be limited in such sequence, and other suitable sequence of the first trenches 122 and the first dielectric layer portions 124 are within the contemplated scope of the present disclosure.

Figure 3I:
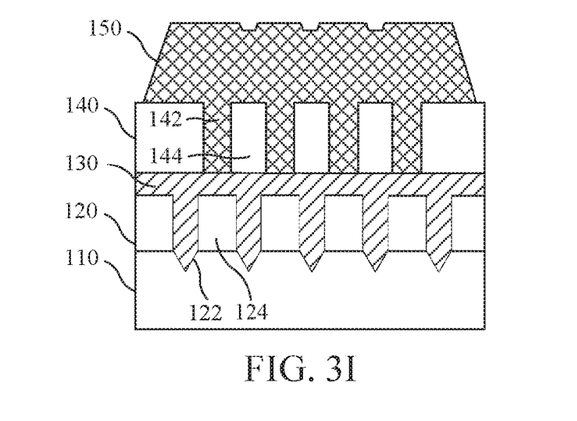

In operation 280, the second semiconductor layer 150 is deposited on the second dielectric layer 140 within the at least one second trench 142, as illustrated in FIG. 3I. In various embodiments, the second trenches 142 are filled with second material to form filled second trenches. In some embodiments, the second semiconductor layer 150 formed of the second material is formed on the second dielectric layer 140 and the filled second trenches. In various embodiments, the operation 280 is a semiconductor (i.e., germanium (Ge)) growth process. In some embodiments, the second semiconductor layer 150 is formed by chemical vapor deposition (CVD), for example, low-pressure CVD (LPCVD), atomic layer CVD (ALCVD), ultrahigh vacuum CVD (UHVCVD), reduced pressure CVD (RPCVD), or other suitable CVDs; molecular beam epitaxy (MBE) process; other suitable epitaxial processes; or combinations thereof. In various embodiments, the second semiconductor layer 150 is made of a semiconductor material, such as germanium (Ge), silicon carbide (SiC), silicon germanium (SiGe), an III-V compound semiconductor, combinations thereof, or the like.

Figure 3J:
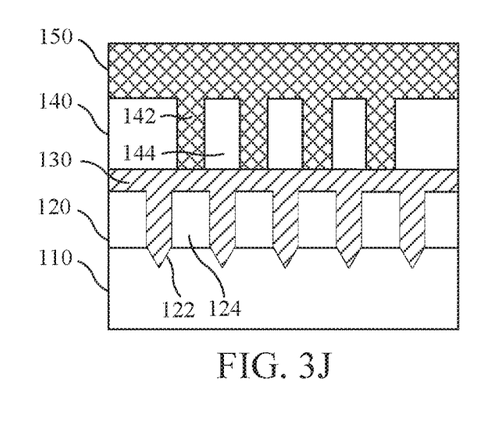

In operation 290, the second semiconductor layer 150 is polished to form a polished second semiconductor layer 150, as illustrated in FIG. 3J. In some embodiments, the operation 290 is a Chemical-Mechanical Polishing (CMP) process.

The above description of the method 200 includes exemplary operations, but the operations of the method 200 are not necessarily performed in the order described. The order of the operations of the method 200 disclosed in the present disclosure are able to be changed, or the operations are able to be executed simultaneously or partially simultaneously as appropriate, in accordance with the spirit and scope of various embodiments of the present disclosure.

Figure 4:
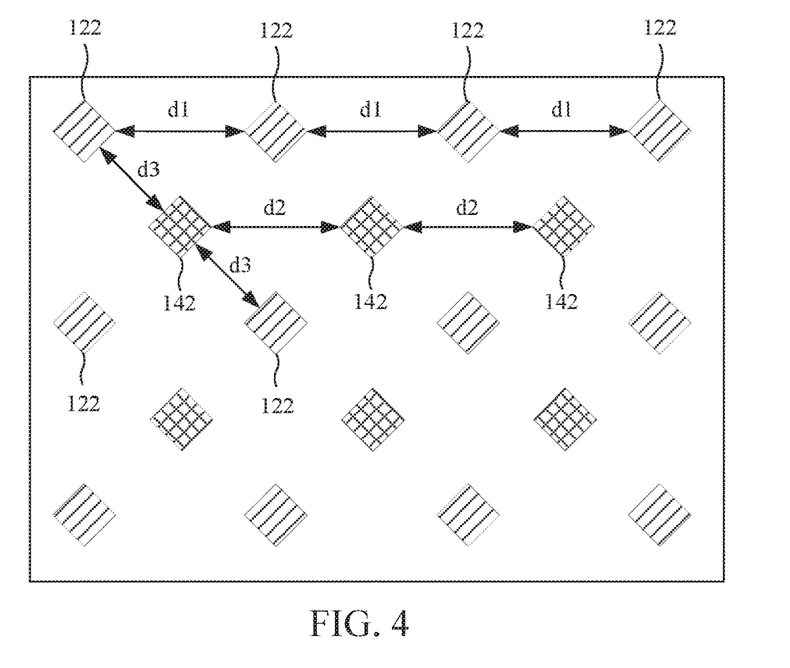
FIG. 4 to FIG. 6 are top views of the semiconductor device in FIG. 1, in accordance with various embodiments.
Figure 5:
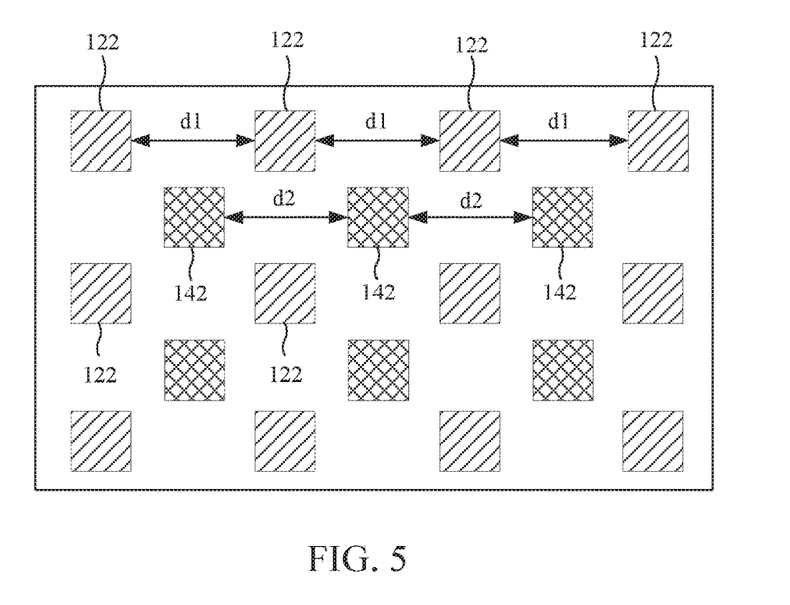
Figure 6:
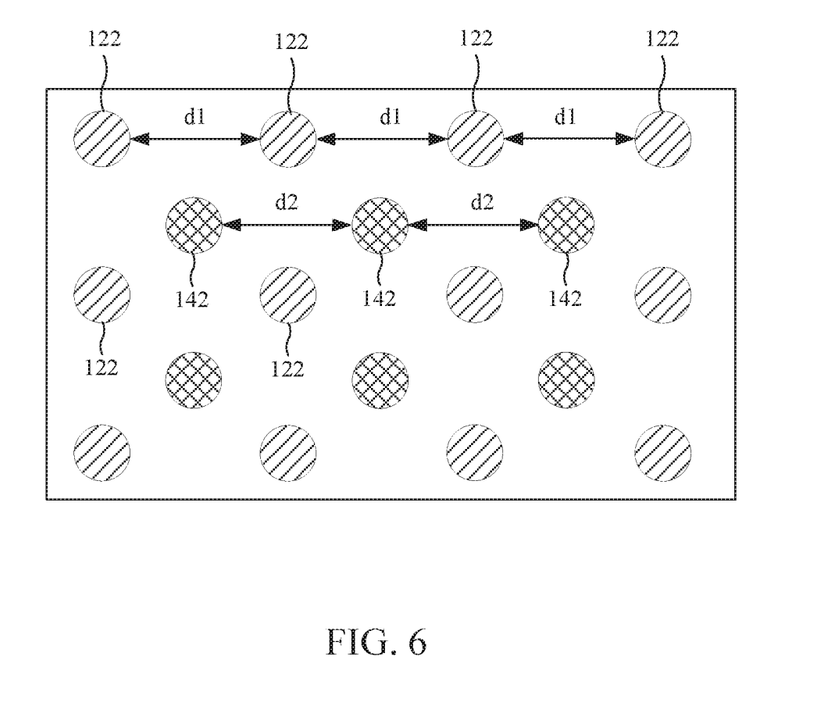

References are now made to FIG. 4, FIG. 5, and FIG. 6. FIG. 4, FIG. 5, and FIG. 6 are top views of the semiconductor device 100 in FIG. 1, in accordance with various embodiments. As illustrated in FIG. 4 to FIG. 6, in a planar view, the first trenches 122 form a first pattern, and the second trenches 142 form a second pattern, and the first pattern has no overlap with the second pattern. As illustrated in FIG. 4 to FIG. 6, first distances (i.e., distances d1) between two of the first trenches 122 which are adjacent to each other are the same, and second distances (i.e., distances d2) between two of the second trenches 142 which are adjacent to each other are the same. In various embodiments, the length of the first distance d1 is the same as that of the second distance d2. However, the scope of the disclosure is not intended to be limited in such arrangements of the first trenches 122 and the second trenches 142, and other suitable arrangements of the first trenches 122 and the second trenches 142 are within the contemplated scope of the present disclosure.

As illustrated in upper left portion of FIG. 4 to FIG. 6, in a planar view, the second trenches 142 is formed in the middle of four first trenches 122 which are adjacent to each other. In some embodiments, the distances (i.e., distances d3) between the first trenches 122 and the second trenches 142 are the same. However, the present disclosure is not limited thereto, and other suitable arrangements of the first trenches 122 and the second trenches 142 are within the contemplated scope of the present disclosure.

The difference between FIG. 4 to FIG. 6 is that the shape of the first trench 122 and the second trench 142 in FIG. 4 is diamond, the shape of the first trench 122 and the second trench 142 in FIG. 5 is square, and the shape of the first trench 122 and the second trench 142 in FIG. 6 is circle. However, the scope of the disclosure is not intended to be limited to the shape of the first trench 122 and the second trench 142 as illustrated in FIG. 4 to FIG. 6, and other suitable shapes of the first trench 122 and the second trench 142 are within the contemplated scope of the present disclosure.

In some embodiments, a semiconductor device is disclosed that includes a substrate, a first dielectric layer, a first semiconductor layer, a second dielectric layer and a second semiconductor layer. The first dielectric layer is disposed on the substrate and includes at least one first trench formed in the first dielectric layer. The first semiconductor layer is disposed on the first dielectric layer and within the at least one first trench. The second dielectric layer is disposed on the first semiconductor layer and includes at least one second trench formed in the second dielectric layer, wherein in a planar view, the at least one first trench and the at least one second trench are not overlapped with each other. The second semiconductor layer is disposed on the second dielectric layer and within the at least one second trench.

Also disclosed is a method for fabricating a semiconductor device includes operations outlined below. A first dielectric layer is deposited on a substrate. At least one first trench is formed in the first dielectric layer. A first semiconductor layer is deposited on the first dielectric layer within the at least one first trench. A second dielectric layer is deposited on the first semiconductor layer. At least one second trench is formed in the second dielectric layer, wherein the first trench is disposed with respect to the second trench in an interlaced manner. A second semiconductor layer is deposited on the second dielectric layer within the at least one second trench.

Also disclosed is a method for fabricating a semiconductor device includes operations outlined below. A first dielectric layer is deposited on a substrate. The first dielectric layer is etched to form first trenches. The first trenches are filled with first material to form filled first trenches. A first semiconductor layer is deposited on the first dielectric layer and the filled first trenches. A second dielectric layer is deposited on the first semiconductor layer. The second dielectric layer is etched to form second trenches, wherein each one of the first trenches is not aligned with the second trenches. The second trenches are filled with second material to form filled second trenches, and forming a second semiconductor layer formed of the second material on the second dielectric layer and the filled second trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    depositing a first dielectric layer on a substrate;
    forming at least one first trench in the first dielectric layer;
    overfilling the at least one first trench with a first semiconductor layer, such that the first semiconductor layer has a portion over a top surface of the first dielectric layer;
    depositing a second dielectric layer on the first semiconductor layer, such that said portion of the first semiconductor layer over the top surface of the first dielectric layer is interposed between the first dielectric layer and the second dielectric layer after depositing the second dielectric layer;

forming at least one second trench in the second dielectric layer; and depositing a second semiconductor layer on the second dielectric layer within the at least one second trench.

2. The method of claim 1, wherein the at least one first trench is not aligned with the at least one second trench.

3. The method of claim 1, wherein forming at least one first trench in the first dielectric layer comprises:

etching the first dielectric layer to form first trenches;

forming at least one second trench in the second dielectric layer comprises:

etching the second dielectric layer to form second trenches and second dielectric layer portions, wherein each one of the second trenches is interposed between two of the second dielectric layer portions;

wherein the first trenches vertically overlap with the second dielectric layer portions, respectively.

4. The method of claim 1, wherein the second semiconductor layer comprises a first material, and the first semiconductor layer comprises at least the first material.

5. The method of claim 1, wherein the first semiconductor layer and the second semiconductor layer are formed of a same material.

6. The method of claim 1, wherein the second semiconductor layer is formed of germanium (Ge), and the first semiconductor layer is formed of at least germanium (Ge).

7. The method of claim 1, further comprising:

polishing the first semiconductor layer to form a polished first semiconductor layer;

wherein depositing the second dielectric layer on the first semiconductor layer comprises:

depositing the second dielectric layer on the polished first semiconductor layer.

8. The method of claim 1, further comprising:

polishing the second semiconductor layer to form a polished second semiconductor layer.

9. A method for fabricating a semiconductor device, comprising:

depositing a first dielectric layer on a substrate;

etching the first dielectric layer to form first trenches;

filling the first trenches with first material to form filled first trenches;

depositing a first semiconductor layer on the first dielectric layer and the filled first trenches;

depositing a second dielectric layer on the first semiconductor layer;

etching the second dielectric layer to form second trenches, wherein each one of the first trenches is not aligned with the second trenches; and filling the second trenches with second material to form filled second trenches, and forming a second semiconductor layer formed of the second material on the second dielectric layer and the filled second trenches.

10. The method of claim 9, wherein in a planar view, the first trenches form a first pattern, and the second trenches form a second pattern, and the first pattern has no overlap with the second pattern.

11. The method of claim 9, wherein in a planar view, first distances between two of the first trenches which are adjacent to each other are the same, and second distances between two of the second trenches which are adjacent to each other are the same, wherein the first distance is the same as the second distance.

12. The method of claim 9, wherein the first material and the second material are the same.

13. The method of claim 9, further comprising:

polishing the first semiconductor layer to form a polished first semiconductor layer wherein depositing the second dielectric layer on the first semiconductor layer comprises:

depositing the second dielectric layer on the polished first semiconductor layer.

14. A method for fabricating a semiconductor device, comprising:

forming at least one first trench in a first dielectric layer deposited on a substrate;

depositing a first semiconductor layer on the first dielectric layer, within the at least one first trench;

forming at least one second trench in a second dielectric layer deposited on the first semiconductor layer, wherein in a planar view, the at least one first trench and the at least one second trench are not overlapped with each other; and depositing a second semiconductor layer on the second dielectric layer, within the at least one second trench.

15. The method of claim 14, wherein the at least one first trench is not aligned with the at least one second trench.

16. The method of claim 14, wherein forming at least one first trench in the first dielectric layer comprises:

etching the first dielectric layer to form first trenches;

forming at least one second trench in the second dielectric layer comprises:

etching the second dielectric layer to form second trenches and second dielectric layer portions, wherein each one of the second trenches is interposed between two of the second dielectric layer portions;

wherein the first trenches vertically overlap with the second dielectric layer portions, respectively.

17. The method of claim 14, wherein the second semiconductor layer comprises a first material, and the first semiconductor layer comprises at least the first material.

18. The method of claim 14, wherein the first semiconductor layer and the second semiconductor layer are formed of a same material.

19. The method of claim 14, wherein the second semiconductor layer is formed of germanium (Ge), and the first semiconductor layer is formed of at least germanium (Ge).

20. The method of claim 14, further comprising:

polishing the first semiconductor layer to form a polished first semiconductor layer;

wherein depositing the second dielectric layer on the first semiconductor layer comprises:

depositing the second dielectric layer on the polished first semiconductor layer.

* * * * *